US010292272B2

(12) United States Patent
Velden et al.

(10) Patent No.: US 10,292,272 B2
(45) Date of Patent: May 14, 2019

(54) DEVICE FOR THE ORIENTATION OF CONTACT TERMINALS ON AN ELECTRICAL COMPONENT FOR FITTING TO A CIRCUIT BOARD OF AN ELECTRIC CIRCUIT

(71) Applicant: EPCOS AG, Munich (DE)

(72) Inventors: Florian Velden, Kirchheim (DE); Guenter Feist, Gingen/Fils (DE)

(73) Assignee: EPCOS AG, München (DE)

( * ) Notice: Subject to any disclaimer, the term of this patent is extended or adjusted under 35 U.S.C. 154(b) by 0 days.

(21) Appl. No.: 15/575,300

(22) PCT Filed: Apr. 20, 2016

(86) PCT No.: PCT/EP2016/058775
§ 371 (c)(1),
(2) Date: Nov. 17, 2017

(87) PCT Pub. No.: WO2016/184636
PCT Pub. Date: Nov. 24, 2016

(65) Prior Publication Data
US 2018/0160540 A1 Jun. 7, 2018

(30) Foreign Application Priority Data
May 20, 2015 (DE) .......................... 10 2015 107 972

(51) Int. Cl.
H05K 1/11 (2006.01)
H05K 1/18 (2006.01)
(Continued)

(52) U.S. Cl.
CPC ............... H05K 1/184 (2013.01); H05K 1/11 (2013.01); H05K 3/301 (2013.01); H05K 3/306 (2013.01);
(Continued)

(58) Field of Classification Search
CPC ................. H05K 3/301; H05K 3/3447; H05K 2201/09036; H05K 2201/2072;
(Continued)

(56) References Cited

U.S. PATENT DOCUMENTS

2003/0109170 A1 6/2003 Ashiya et al.
2004/0067665 A1* 4/2004 Nakano ................. H01R 12/57
439/70

(Continued)

FOREIGN PATENT DOCUMENTS

DE 3506064 A1 8/1986
EP 0480754 A2 4/1992
(Continued)

Primary Examiner — Erin B Saad
(74) Attorney, Agent, or Firm — Slater Matsil, LLP

(57) ABSTRACT

A device for orienting contact terminals on an electrical component such that they fit to a circuit board of an electric circuit is disclosed. In an embodiment the device includes a carrier element configured to receive the electrical component and a plurality of bending elements, wherein the carrier element has a plurality of holes, each hole penetrating the carrier element from an upper side to an underside, wherein a respective section of the bending elements is secured to the carrier element and a respective end of the bending elements projects into a respective hole of the carrier element, and wherein the bending elements are configured such that the respective end of the bending elements, upon insertion of a respective contact terminal of the electrical component into the respective hole from the upper side of the carrier element, is bent within the hole and clamps the respective contact terminal.

11 Claims, 8 Drawing Sheets

(51) Int. Cl.
*H05K 3/30* (2006.01)
*H05K 3/34* (2006.01)

(52) U.S. Cl.
CPC ... *H05K 3/3447* (2013.01); *H05K 2201/1003* (2013.01); *H05K 2201/10424* (2013.01); *H05K 2201/10568* (2013.01); *H05K 2201/10878* (2013.01)

(58) Field of Classification Search
CPC ....... H05K 1/0393; H05K 2201/10424; H05K 2201/10606
USPC .......................................................... 439/70
See application file for complete search history.

(56) References Cited

U.S. PATENT DOCUMENTS

2006/0002666 A1  1/2006  Ice
2007/0164083 A1  7/2007  Suehiro

FOREIGN PATENT DOCUMENTS

EP       0651599 A1   5/1995
JP     2008244247 A  10/2008
JP     2012094577 A   5/2012

* cited by examiner

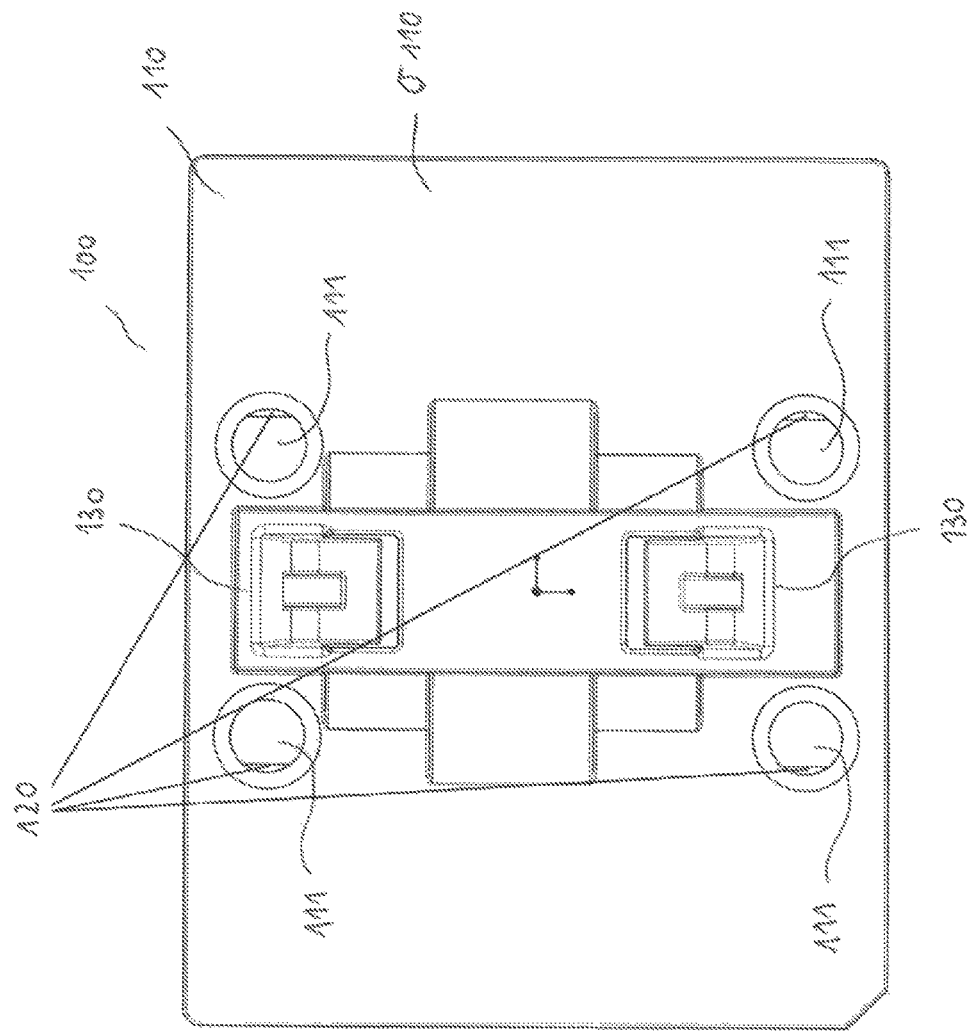

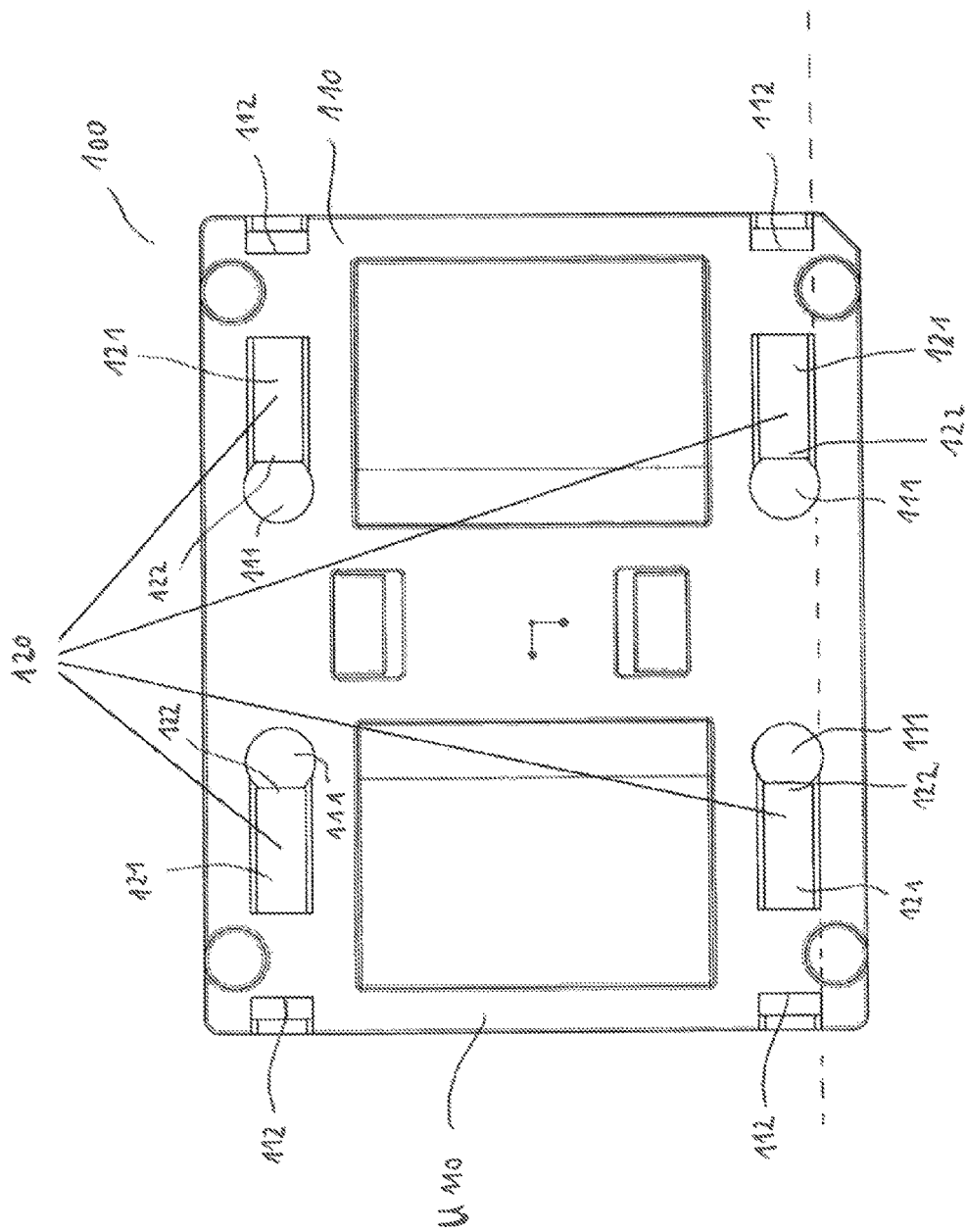

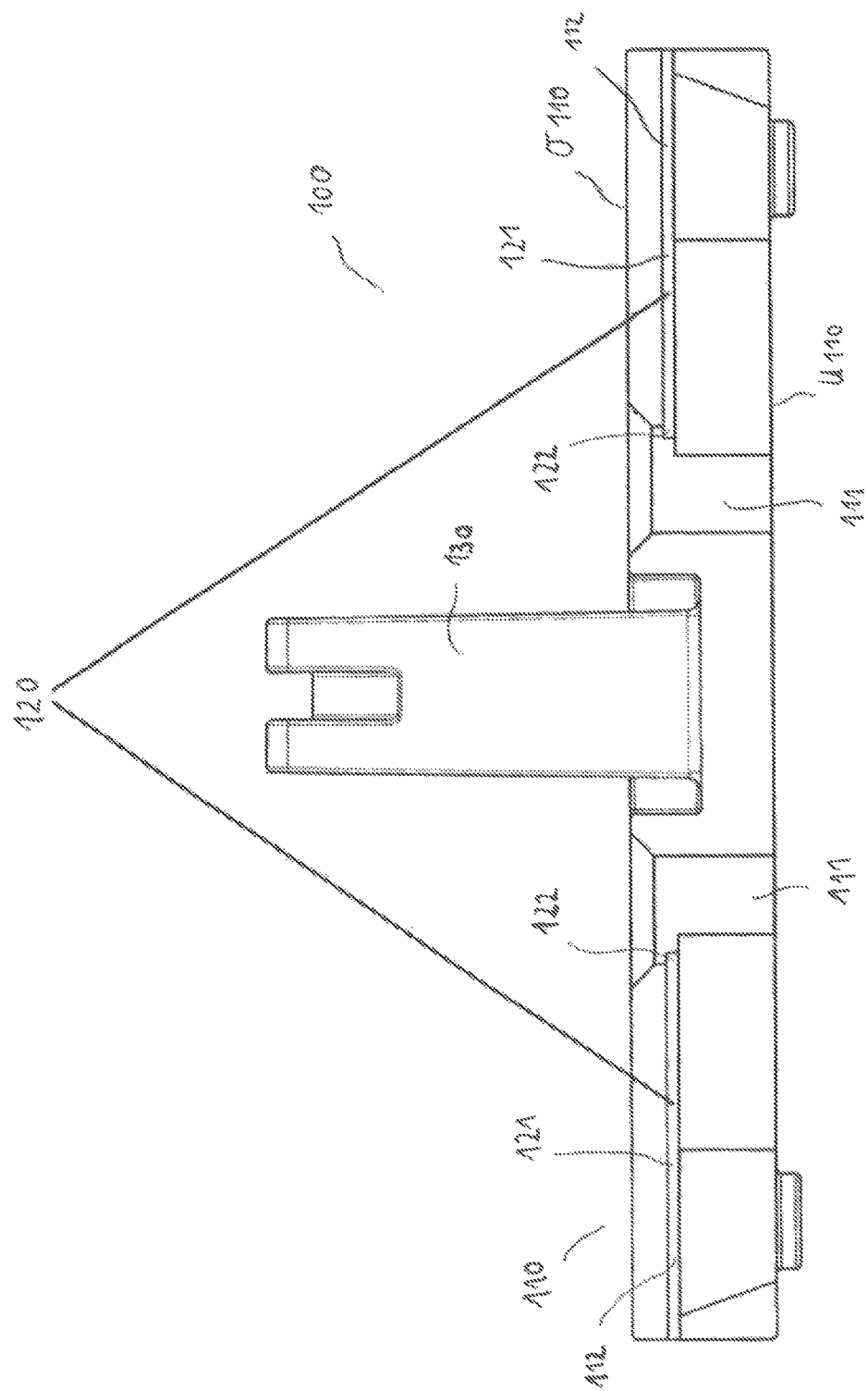

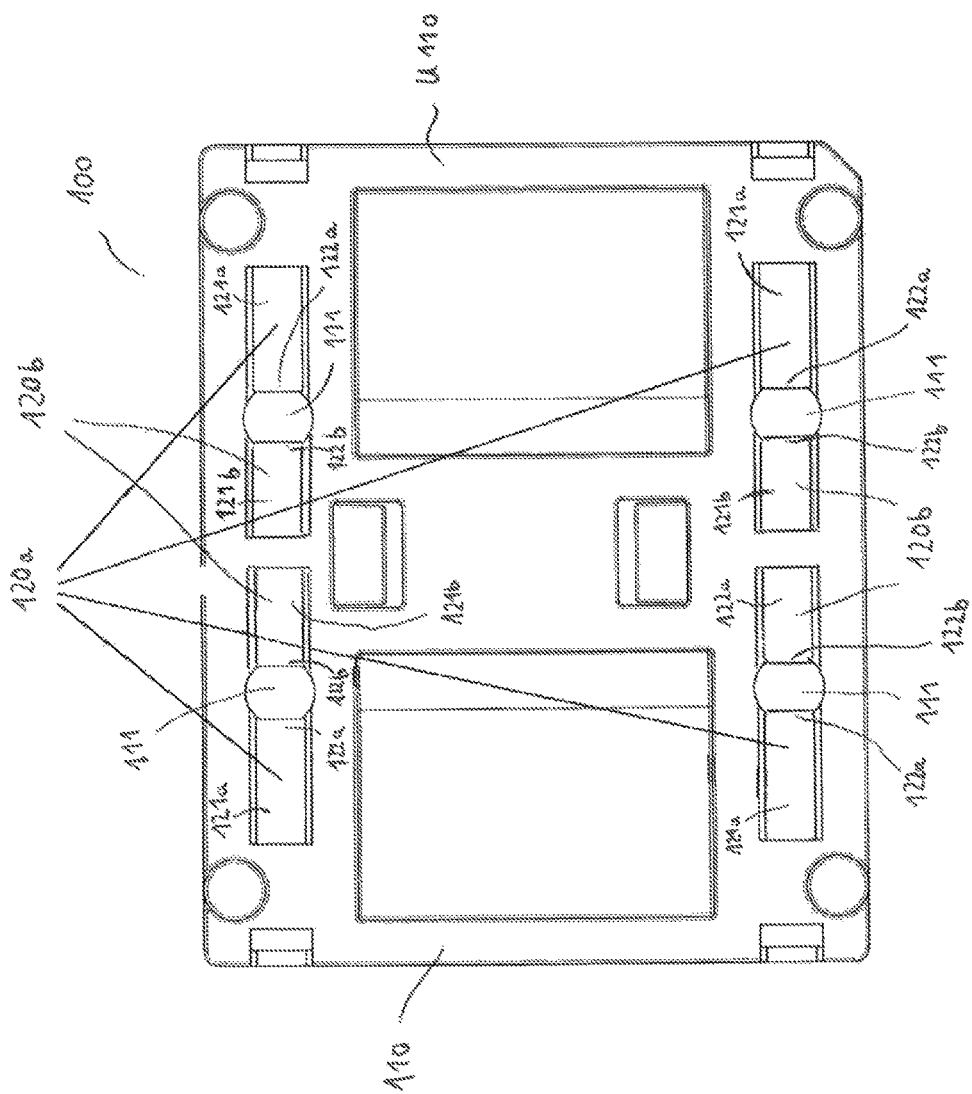

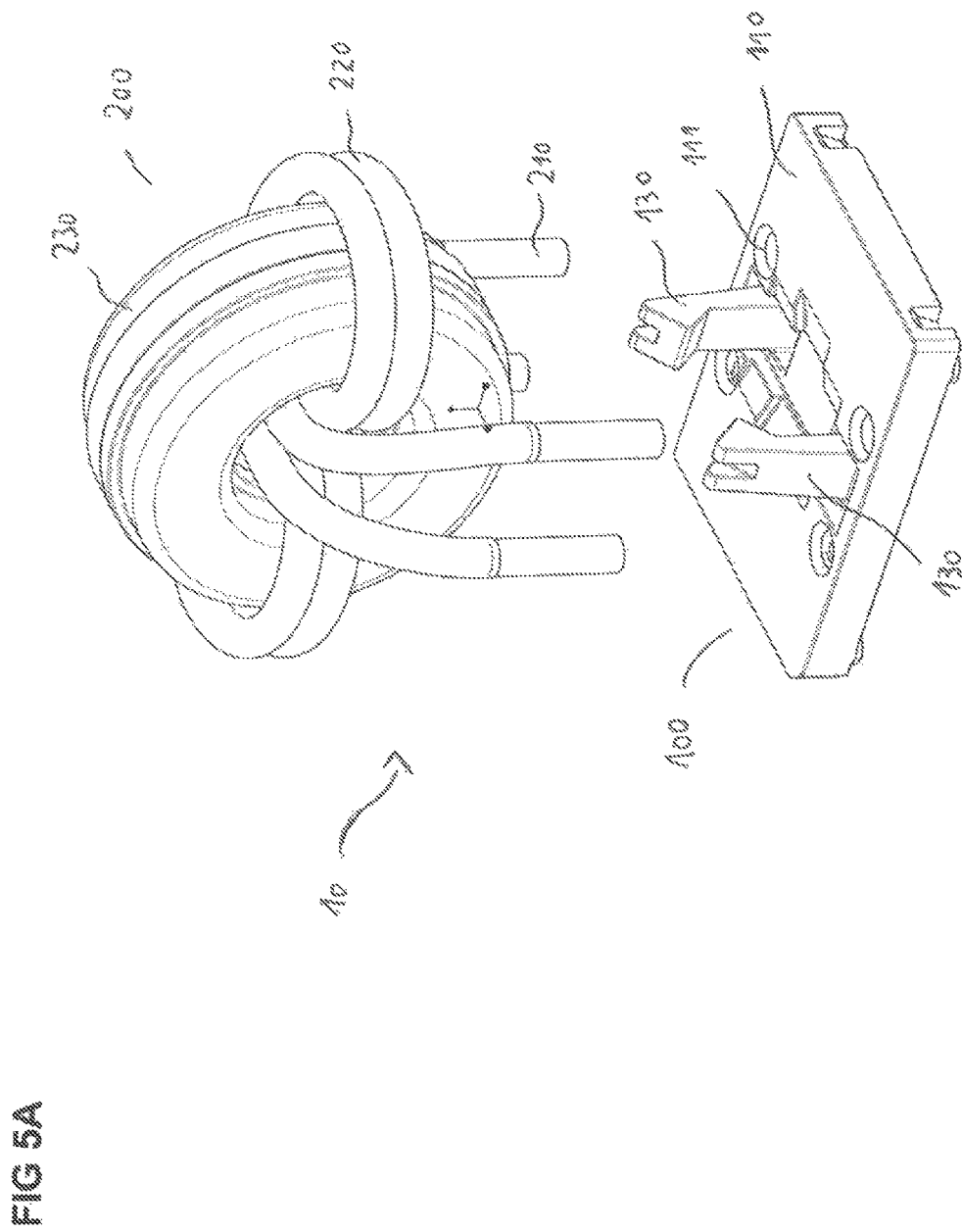

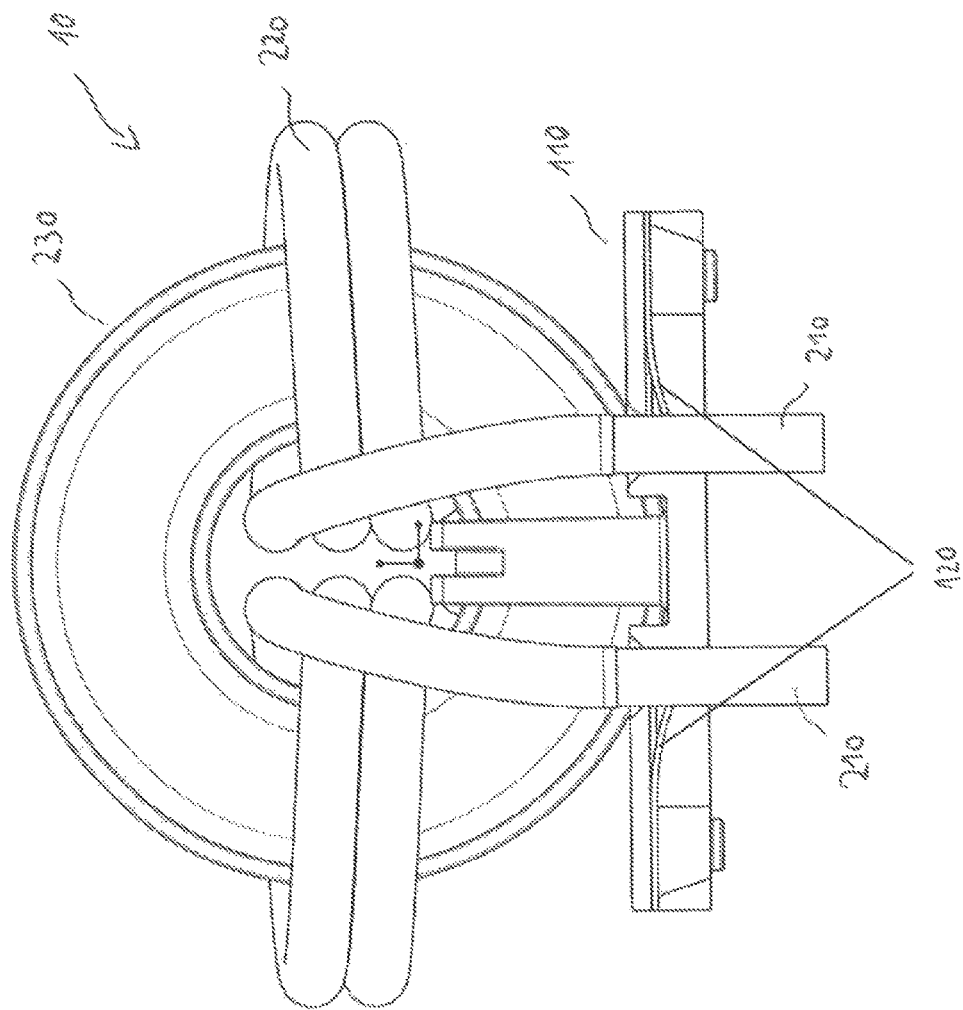

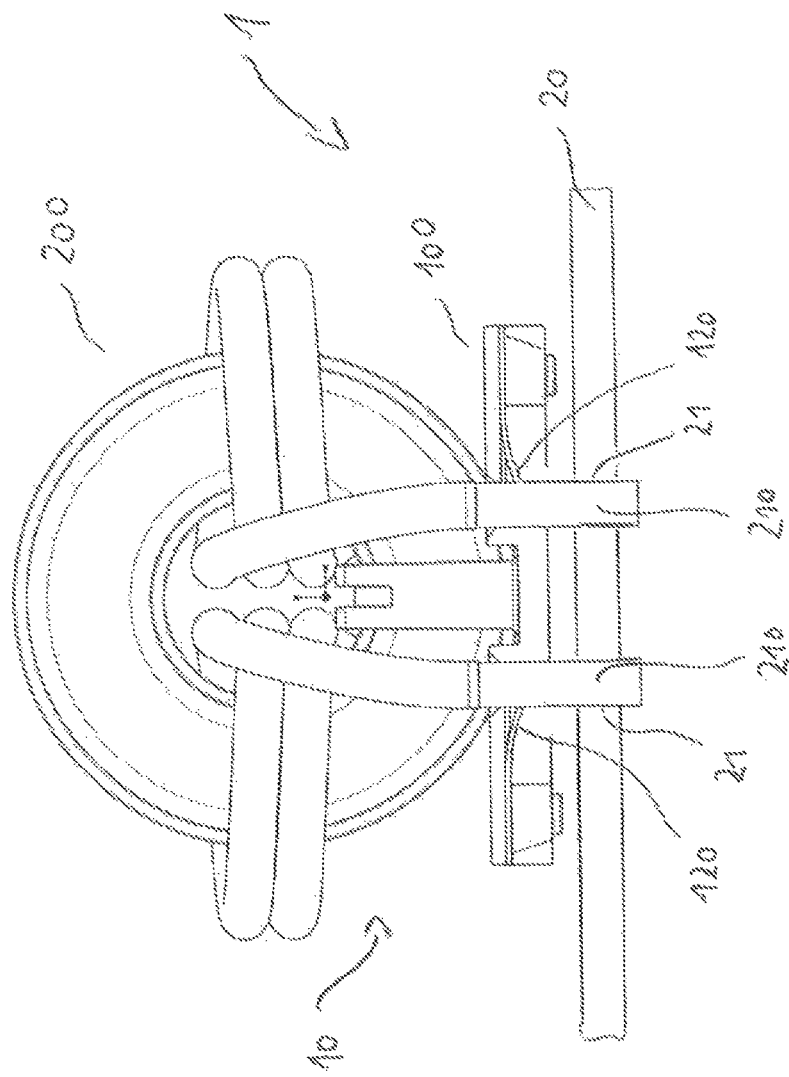

DEVICE FOR THE ORIENTATION OF CONTACT TERMINALS ON AN ELECTRICAL COMPONENT FOR FITTING TO A CIRCUIT BOARD OF AN ELECTRIC CIRCUIT

This patent application is a national phase filing under section 371 of PCT/EP2016/058775, filed Apr. 20, 2016, which claims the priority of German patent application 10 2015 107 972.0, filed May 20, 2015, each of which is incorporated herein by reference in its entirety.

TECHNICAL FIELD

The invention relates to a device for the orientation of contact terminals on an electrical component for fitting to a circuit board of an electric circuit. The invention further relates to an electrical component arrangement having a device of this type. The invention further relates to an electric circuit having an electrical component arrangement of this type.

BACKGROUND

An electric circuit comprises electrical components, which are interconnected. The electrical components are customarily arranged on a circuit board. The mutual connection of the components is achieved by means of conductor tracks on the surface of the circuit board, or within the circuit board. An electrical component is connected to the conductor tracks on the circuit board by means of its contact terminals, for example, by means of contact pins. The circuit board customarily incorporates contact holes, into which the contact terminals, for example, the contact pins, of the electrical component are inserted. Thereafter, the contact terminals are soldered into the contact holes provided for this purpose, such that the electrical component is connected to the conductor tracks on the circuit board, and is secured to the circuit board.

The population of a circuit board with electrical components is generally automated, for example, by means of a pick-and-place method. To this end, the electrical components are picked up by a gripper, and are automatically inserted, by means of their contact terminals or contact pins, into the contact holes in the circuit board. In order to facilitate the pick-up of a component by the pick-and-place machine, and to orientate the contact terminals of the component such that they can be inserted in the contact holes provided for this purpose on the circuit board, the component can be pre-fitted to a device for the orientation of its terminals, for the purposes of fitting to the circuit board. Customarily, a device of this type is also described as a grid plate. The grid plate incorporates holes in a specified grid pattern. For the attachment of the electrical component to the grid plate, the contact terminals of the electrical component are inserted into the holes in the grid plate, and are thus appropriately oriented for being fitted into the contact holes in the circuit board, without the necessity for bending the contact terminals.

SUMMARY OF THE INVENTION

Embodiments of the present invention provide a device for the orientation of contact terminals on an electrical component for fitting to a circuit board of an electric circuit, wherein the contact terminals of the electrical component, in a simple manner, can be fixed in one hole respectively in the device, and the slipping thereof out of the respective hole is prevented. Further embodiments of the present invention provide an electrical component arrangement having a device for the orientation of contact terminals on an electrical component for fitting to a circuit board of an electric circuit, wherein the contact terminals of the electrical component, in a simple manner, can be inserted respectively into one of the holes provided for this purpose on the device and securely fixed therein, such that the slipping of the respective contact terminal out of the respective hole is prevented. Other embodiments of the present invention provide an electric circuit having an electrical component arrangement of this type, by means of which it is possible to orient the contact terminals of the electrical component, and to securely fix the electrical component in the holes provided for this purpose in the device for the orientation of the contact terminals of the electrical component.

In one embodiment, a device for the orientation of contact terminals on an electrical component for fitting to a circuit board of an electric circuit is disclosed. The device comprises a carrier element, to which the electrical component is attachable, and a plurality of bending elements. The carrier element has a plurality of holes, which respectively penetrate the carrier element from an upper side to an underside of said carrier element. A respective section of the bending elements is secured to the carrier element. A respective end of the bending elements projects into a respective hole in the carrier element. The bending elements are configured such that the respective end of the bending elements, upon the insertion of a respective contact terminal of the electrical component into the respective hole from the upper side of the carrier element, is bent within the hole in the direction of the underside of the carrier element and clamps the respective contact terminal of the electrical component, such that the electrical component is fixed to the carrier element.

In another embodiment, an electrical component arrangement having an electrical component, the contact terminals of which are oriented for being fitted to a circuit board of an electric circuit, is. The electrical component arrangement comprises, in addition to the electrical component with the contact terminals, the device for the orientation of the contact terminals on the electrical component for fitting to the circuit board of the electric circuit. A respective contact terminal of the electrical component is inserted in the respective hole in the carrier element, and is clamped to the carrier element by the respective bent end of the bending elements.

In yet another embodiment, an electric circuit, wherein the contact terminals of an electrical component are oriented for fitting to the circuit board, is disclosed. The electric circuit comprises the above-mentioned electrical component arrangement and a circuit board. The electrical component arrangement is arranged on the circuit board such that the device for the orientation of the contact terminals on the electrical component for fitting to the circuit board of the electric circuit is arranged between the circuit board and the electrical component.

The carrier element of the device can be manufactured from any material which can be injection-molded, cast, milled, compressed or molded. The bending elements can be injected, inserted or molded into the carrier element. The bending elements can each be configured, for example, in the form of a bendable plate. The bending elements can be manufactured from metal or plastic.

In the unfitted state, the bending elements are initially straight. The bending elements are fitted to the carrier element such that a part thereof, for example, the end thereof, projects into the respective hole, through which a pin wire of the electrical component is inserted during assembly. The number of holes in the carrier element corresponds to that of the electrical component to be arranged on the carrier element. In the case of components with, for example, between 2 and 64 pins, a corresponding number of holes can be provided in the carrier element.

If, upon the fitting of the electrical component to the device or the grid plate, the contact terminals, for example, the wires or contact pins, are inserted through the holes of the carrier element, the ends of the bending elements which project into the holes are bent downwards. Accordingly, the respective holes for the contact terminals or contact pins of the components are entirely released, such that the contact terminals fully inserted into the holes, and project from the holes on the underside of the carrier element.

Once the fitting of an electrical component on the carrier element of the device is complete, the withdrawal of the contact terminals or contact pins of the electrical component is no longer possible, as the contact terminals are immobilized by the respective bent bending element, for example, a bent plate. The respective ends of the bending elements can no longer be bent back, such that the contact terminals of the electrical component are thus securely attached to the carrier element.

The device for the orientation of contact terminals on an electrical component for fitting to a circuit board of an electric circuit can be employed for contact terminals or contact pins of wire gauge ranging from 0.01 mm to 10 mm. The device can be employed for the fixing of electrical components, the contact terminals of which are either configured as round wires or as flat wires. The contact terminals of an electrical component, which can be fixed in the holes in the carrier element by means of the bending elements, can be configured as an SMD (surface-mounted device) or as a PTH (pin through-hole).

According to one potential form of embodiment, in place of one bending element, a plurality of bending elements can also be employed within one of the holes. The position of the bending elements within the respective hole in the carrier element can vary from a one-sided to a two-sided arrangement.

BRIEF DESCRIPTION OF THE DRAWINGS

The invention is described in greater detail hereinafter with reference to figures, which represent exemplary embodiments of the present invention, in which:

FIG. 1 shows an upper side of a device for the orientation of contact terminals on an electrical component for fitting to a circuit board of an electric circuit;

FIG. 2 shows an underside of a device for the orientation of contact terminals on an electrical component for fitting to a circuit board of an electric circuit;

FIG. 3 shows a cross section of a device for the orientation of contact terminals on an electrical component for fitting to a circuit board of an electric circuit;

FIG. 4 shows one form of embodiment of a device for the orientation of contact terminals on an electrical component for fitting to a circuit board of an electric circuit, having a plurality of bending elements within one of the holes in the carrier element;

FIG. 5A shows a perspective view of an electrical component arrangement with an electrical component, prior to fitting to a device for the orientation of contact terminals on the electrical component;

FIG. 5C shows an electrical component arrangement with an electrical component, fitted to a device for the orientation of the contact terminals on the electrical component, in a sectional view; and FIG. 6 shows one form of embodiment of an electric circuit, with an electrical component arrangement fitted to a circuit board of the electric circuit.

DETAILED DESCRIPTION OF ILLUSTRATIVE EMBODIMENTS

Figure 5B:
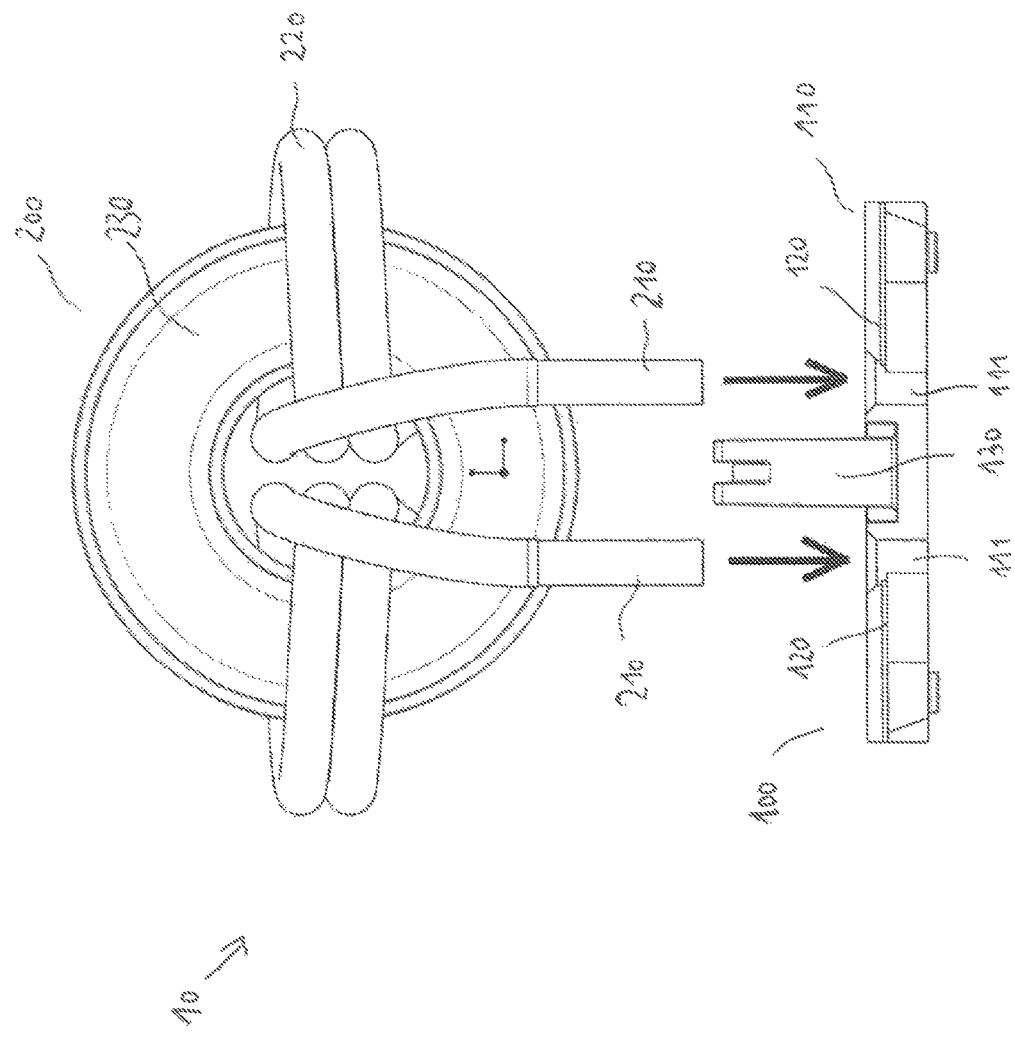
FIG. 5B shows an electrical component arrangement with an electrical component, prior to fitting to a device for the orientation of contact terminals on the electrical component, in a sectional view.

FIGS. 1 and 2 show, in the sequence indicated, a device 100 for the orientation of contact terminals on an electrical component for fitting to a circuit board of an electric circuit, viewed from an upper side and an underside. FIG. 3 shows a sectional view of the device 100 for the orientation of contact terminals on an electrical component for fitting to a circuit board of an electric circuit. The configuration of the device 100, which is also designated as a grid plate, is described hereinafter with reference to FIGS. 1 to 3. FIGS. 3 and 5B illustrate a cross section of a device for the orientation of contact terminals of an electrical component for fitting to a circuit board along the dashed line illustrated in FIG. 2.

The device 100 for the orientation of contact terminals on an electrical component for fitting to a circuit board of an electric circuit comprises a carrier element 110, to which the electrical component is attachable. The device 100 moreover comprises a plurality of bending elements 120. The carrier element 110 moreover has a plurality of holes 111, which respectively penetrate the carrier element 110 from an upper side O110 to an underside U110 of the carrier element. A respective section 121 of the bending elements 120 is secured to the carrier element 110. A respective end 122 of the bending elements 120 projects into a respective hole 111 in the carrier element 110.

The bending elements 120 are configured such that the respective end 122 of the bending elements, upon the insertion of a respective contact terminal of the electrical component into the respective hole 111 from the upper side O110 of the carrier element, is bent within the hole 111 in the direction of the underside U110 of the carrier element 110 and clamps the respective contact terminal of the electrical component, such that the electrical component is fixed to the carrier element 110.

According to one potential form of embodiment, the carrier element 110 can be formed of a plastic material. The respective section 121 of the bending elements 120 can be embedded in the material of the carrier element 110. Specifically, the respective section 121 of the bending elements can be cast or molded into the material of the carrier element 110. According to an alternative form of embodiment, the respective section 121 of the bending elements 120 can also be molded onto the carrier element 110.

According to one potential form of embodiment, the carrier element 110 incorporates a plurality of gaps 112. The respective section 121 of the bending elements 120 can be inserted in a respective gap 112. The respective gap 112 opens into a respective hole 111 in the carrier element 110. The bending elements 120 can, for example, be inserted in the respective gap 112 in the carrier element 110 to the extent that their respective end 122 projects into a respective hole 111 in the carrier element.

According to a further potential form of embodiment, the bending elements 120 can be formed of a metal or plastic material. Specifically, the bending elements 120 can each be configured as a bendable plate, which can be injected, inserted or molded into the carrier element of plastic material.

Prior to attachment to the carrier element 110, the bending elements are straight. After attachment to the carrier element, the respective end 122 of the bending elements 120, in the unbent state, projects into the hole 111, perpendicularly to the longitudinal direction of the respective hole 111 in the carrier element 110. Specifically, the bending elements 120 can be respectively configured such that the respective end 122 of the bending elements, upon the insertion of the respective contact terminal of the electrical component into the hole 111 provided in the carrier element for this purpose from the upper side of the carrier element, is bent within the hole 111 by the contact terminal of the electrical component in the direction of the underside U110 of the carrier element 110.

According to one potential form of embodiment, the respective end 122 of the bending elements 120 projects into the respective hole 111 in the carrier element 110 such that the diametral surface area of the hole 111 is reduced by 0.1% to 50%.

FIG. 4 shows a further form of embodiment of the device 100 for the orientation of contact terminals on an electrical component for fitting to a circuit board of an electric circuit. Rather than the arrangement of only a single bending element in each of the holes 111 in the carrier element, a plurality of bending elements can also be provided, the respective ends of which project into the respective hole.

FIG. 4 shows an exemplary representation of the bending elements 120a, 120b, the respective sections 121a and 121b of which are attached to the carrier element 11o. The respective ends 122a or 122b of the bending elements 120a and 120b project from different sides into the respective hole 111 in the carrier element 110. In the exemplary embodiment represented in FIG. 4, the respective ends 122a and 122b of the bending elements 120a and 120b project from opposing sides into the respective hole 111 in the carrier element 110. In place of the two bending elements 120a and 120b, further bending elements can be provided, the respective ends of which, from different directions, terminate in one of the respective holes 111 in the carrier element 110.

FIG. 5A shows a perspective view of an electrical component arrangement 10 prior to the fitting of an electrical component 200 with contact terminals 210 to the carrier element 110 of the device 100 for the orientation of the contact terminals 210 of the electrical component 200. In the example represented, the electrical component 200 is configured as a reactor coil. The contact terminals 210 of the electrical component 200 are configured as terminations of electrical conductors 220. The electrical conductors 220 are wound around a core 230 of the electrical component.

FIG. 5B shows a view of an electrical component arrangement 10 prior to the fitting of the electrical component 200 to the sectionally-represented device 100 for the orientation of the contact terminals 210 on the electrical component 200. The arrows indicate the direction of insertion of the contact terminals 210 of the electrical component into the holes 111 in the carrier element 110 of the device 100.

FIG. 5C shows a fully-assembled electrical component arrangement 10, with the electrical component 200 which is fitted to the device 100 for the orientation of the contact terminals 210 of the electrical component 200. The contact terminals 210 thus penetrate from the upper side O110 of the carrier element 110 into the respective holes 111 provided in the carrier element for this purpose. The ends 122 of the bending elements 120 are bent downwards in the direction of the underside U110 of the carrier element 110. The contact terminals 210 of the electrical component 200 are thus clamped to the carrier element 110. As a result of the bending of the ends 122 of the bending elements 120, the contact terminals 210 of the electrical component 200 can no longer be withdrawn, and are thus securely fixed within the holes 111 in the carrier element 110.

The carrier element 110 can incorporate retaining elements 130 for the retention of the core 230 of the electrical component 200. The retaining elements 130 can be configured as latching hooks, into which the core 230 of the electrical component is latched upon the insertion of the contact terminals 210 of the electrical component into the holes 111 in the carrier element 110.

FIG. 6 represents a form of embodiment of an electric circuit 1 with the electrical component arrangement 10, which is fitted to a circuit board 20 of the electric circuit. The circuit board 20 incorporates contact holes 21 for the contacting of the contact terminals 210 of the electrical component 200 with the conductor tracks on the circuit board. The respective contact terminals 210 of the electrical component which, on the underside U110 of the carrier element 110, project from the respective holes 111 in the carrier element 110, are fitted in the respective contact holes 21 of the circuit board 20. The electrical component arrangement 10 is thus arranged on the circuit board 20 such that the device 100 for the orientation of the contact terminals 210 on the electrical component 200 is arranged between the circuit board 20 and the electrical component 200.

The device 100 permits the orientation of the contact terminals 210 on the electrical component, such that the electrical component 200 or the electrical component arrangement 10 can be fitted in the contact holes 21 provided for this purpose in the circuit board 20 in a simple manner, by means of a gripper on a pick-and-place machine. The bending elements 120 secure the electrical component 200 to the carrier element 110 of the device 100, and prevent any slipping out of the contact terminals 210 of the electrical component 200 upon the fitting of the electrical component 200 to the circuit board 20.

The invention claimed is:

1. A device for orienting contact terminals of an electrical component so that they fit to a circuit board of an electric circuit, the device comprising:
   a carrier element configured to receive the electrical component; and
   a plurality of bending elements,
   wherein the carrier element has a plurality of holes, each hole penetrating the carrier element from an upper side to an underside of the carrier element,
   wherein a respective section of the bending elements is secured to the carrier element and a respective end of the bending elements projects into a respective hole of the carrier element, and
   wherein the bending elements are configured such that the respective end of the bending elements, upon insertion of a respective one of the contact terminals of the electrical component into the respective hole from the upper side of the carrier element, is bent within the hole in a direction of the underside of the carrier element and clamps the respective one of the contact terminals of the electrical component such that the electrical component is fixed to the carrier element.

2. The device according to claim 1, wherein the carrier element is made of a plastic material.

3. The device according to claim 1, wherein the respective section of the bending elements is embedded in a material of the carrier element.

4. The device according to claim 1, wherein the carrier element incorporates a plurality of gaps, wherein the respective section of the bending elements is inserted in a respective gap, and wherein the respective gap opens into a respective hole in the carrier element.

5. The device according to claim 1, wherein the bending elements are made of a metal or a plastic material.

6. The device according to claim 1, wherein the respective end of the bending elements, in an unbent state, projects into the respective hole, perpendicularly to a longitudinal direction of the respective hole in the carrier element.

7. The device according to claim 1, wherein the bending elements are configured such that the respective end of the bending elements, upon insertion of the respective contact terminal of the electrical component into the respective hole in the carrier element from the upper side of the carrier element, is bent within the hole by the contact terminal in the direction of the underside of the carrier element.

8. The device according to claim 1, wherein the respective ends of at least two of the bending elements project from different sides into the respective hole in the carrier element.

9. The device according to claim 1, wherein each of the bending elements is configured as a bendable plate.

10. An electrical component arrangement comprising:
the device for orienting contact terminals of the electrical component so that they fit to the circuit board of the electric circuit according to claim 1; and
the electrical component with the contact terminals,
wherein a respective contact terminal of the electrical component is inserted in a respective hole in the carrier element, and is clamped to the carrier element by the respective bent end of the bending elements of the device.

11. An electric circuit comprising:
the electrical component arrangement according to claim 10; and
the circuit board with contact terminals,
wherein the respective contact terminals of the electrical component which, on the underside of the carrier element, project from the respective holes in the carrier element, are fitted in respective contact holes of the circuit board, and
wherein the device for the orientation of the contact terminals on the electrical component for fitting to the circuit board of the electric circuit is arranged between the circuit board and the electrical component.

* * * * *